(12) United States Patent
Chen et al.

(10) Patent No.: US 10,701,807 B2
(45) Date of Patent: Jun. 30, 2020

(54) MULTI-LAYER CIRCUIT BOARD STRUCTURE

(71) Applicant: Chicony Electronics Co., Ltd., New Taipei (TW)

(72) Inventors: Wei-Cheng Chen, New Taipei (TW); Jin-Kae Jang, New Taipei (TW)

(73) Assignee: CHICONY ELECTRONICS CO., LTD., New Taipei (TW)

( * ) Notice: Subject to any disclaimer, the term of this patent is extended or adjusted under 35 U.S.C. 154(b) by 0 days.

(21) Appl. No.: 16/267,760

(22) Filed: Feb. 5, 2019

(65) Prior Publication Data
US 2020/0113052 A1 Apr. 9, 2020

(30) Foreign Application Priority Data

Oct. 4, 2018 (TW) .............................. 107135139 A (51) Int. Cl.
H05K 7/20 (2006.01)
H05K 1/14 (2006.01)
H05K 1/18 (2006.01)
H05K 1/02 (2006.01)

(52) U.S. Cl.
CPC .......... *H05K 1/144* (2013.01); *H05K 1/0203* (2013.01); *H05K 1/18* (2013.01); *H05K 7/20509* (2013.01); *H05K 2201/042* (2013.01); *H05K 2201/066* (2013.01); *H05K 2201/09063* (2013.01); *H05K 2201/10409* (2013.01)

(58) Field of Classification Search
None
See application file for complete search history.

(56) References Cited

U.S. PATENT DOCUMENTS

| | | | | |
|---|---|---|---|---|
| 4,793,814 A | * | 12/1988 | Zifcak | H01R 13/2435 439/66 |
| 5,297,967 A | * | 3/1994 | Baumberger | H05K 7/1069 439/66 |
| 6,224,396 B1 | * | 5/2001 | Chan | H05K 3/325 439/66 |
| 7,813,130 B2 | | 10/2010 | Ho | |
| 8,749,980 B2 | * | 6/2014 | Won | G06F 1/20 174/258 |

(Continued)

FOREIGN PATENT DOCUMENTS

TW 200948256 A 11/2009

*Primary Examiner* — Courtney L Smith
(74) *Attorney, Agent, or Firm* — Muncy, Geissler, Olds & Lowe, P.C.

(57) ABSTRACT

A multi-layered circuit board structure includes a first circuit board, a second circuit board, and a heat dissipation plate. The first circuit board includes a first surface. The second circuit board includes a second surface facing the first surface. The heat dissipation plate is located between the first circuit board and the second circuit board. The heat dissipation plate includes a substrate and a fixing base integrally extending from the substrate and bent. The fixing base includes a connecting plate, a first plate, and a second plate spaced apart from the first plate. The connecting plate is connected between the first plate and the second plate. The first surface is bonded to a surface of the first plate, the second surface is bonded to a surface of the second plate, and the substrate is in contact with neither the first surface nor the second surface.

17 Claims, 6 Drawing Sheets

(56) References Cited

U.S. PATENT DOCUMENTS

| | | | |
|---|---|---|---|
| 9,565,759 B2* | 2/2017 | Hougham | H01R 12/7082 |
| 2002/0117330 A1* | 8/2002 | Eldridge | B23K 20/004 |
| | | | 174/260 |
| 2018/0138609 A1* | 5/2018 | Coteus | H01R 12/52 |

* cited by examiner

MULTI-LAYER CIRCUIT BOARD STRUCTURE

CROSS-REFERENCE TO RELATED APPLICATION

This non-provisional application claims priority under 35 U.S.C. § 119(a) to Patent Application No. 107135139 filed in Taiwan, R.O.C. on Oct. 4, 2018, the entire contents of which are hereby incorporated by reference.

BACKGROUND

Technical Field

The instant disclosure relates to a circuit board structure, in particular, to a multi-layer circuit board structure.

Related Art

Along with the developments of technologies, the functions of electronic devices become diverse. However, due to the trends to thin and light designs for the electronic devices, some electronic devices have stacked circuit boards configurations for disposing components as much as possible within limited spaces.

SUMMARY

Currently, the stacking structure of a multi-layered circuit board structure known to the inventor(s) have several bolt holders between two circuit boards, and bolts pass through the two circuit boards and thread with the bolt holders, so that the two circuit boards can be positioned at opposite sides of the bolt holders and spaced apart from each other. Furthermore, a heat dissipation device is further assembled between the two circuit boards for dissipating heats of the electronic components of the circuit boards. Therefore, the multi-layered circuit board structure known to the inventor(s) has many units; that is, the operator has to perform steps such as threading the bolt holders respectively with the two circuit boards and assembling the heat dissipation device between the two circuit boards, such that the assembling procedure is complicated and time consuming.

In view of this, in one embodiment, a multi-layered circuit board structure is provided and the multi-layered circuit board structure comprises a first circuit board, a second circuit board, and a heat dissipation plate. The first circuit board comprises a first surface. The second circuit board comprises a second surface facing the first surface. The heat dissipation plate is located between the first circuit board and the second circuit board. The heat dissipation plate comprises a substrate and a fixing base. The fixing base is integrally extending from the substrate and bent. The fixing base comprises a connecting plate, a first plate, and a second plate spaced apart from the first plate. The connecting plate is connected between the first plate and the second plate. The first surface of the first circuit board is bonded to a surface of the first plate, the second surface of the second circuit board is bonded to a surface of the second plate, and the substrate is in contact with neither the first surface nor the second surface.

Accordingly, in the multi-layered circuit board structure of one or some embodiments of the instant disclosure, the fixing base is integrally extending from the heat dissipation plate and bent. Therefore, in the manufacturing process, the first plate and the second plate of the fixing base are respectively bonded with the first surface of the first circuit board and the second surface of the second circuit board to form the multi-layer circuit board structure. Hence, additional components (e.g., bolt holders) are not required to keep the first circuit board and the second circuit board spaced apart from each other, and the manufacturing steps and time can be effectively reduced. Furthermore, the heat conduction area of the heat dissipation plate can be increased to improve the heat dissipation efficiency.

BRIEF DESCRIPTION OF THE DRAWINGS

The disclosure will become more fully understood from the detailed description given herein below for illustration only, and thus not limitative of the disclosure, wherein.

DETAILED DESCRIPTION

Figure 1:
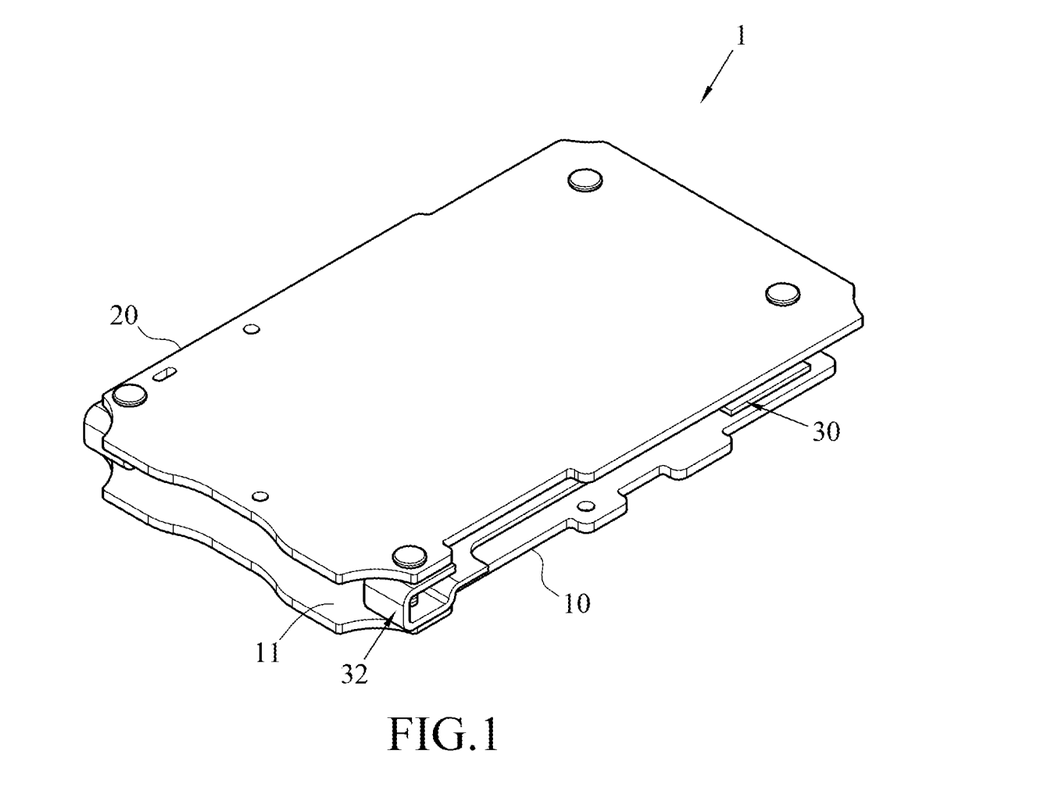
FIG. 1 illustrates a perspective view of a multi-layered circuit board structure according to a first embodiment of the instant disclosure.
Figure 2:
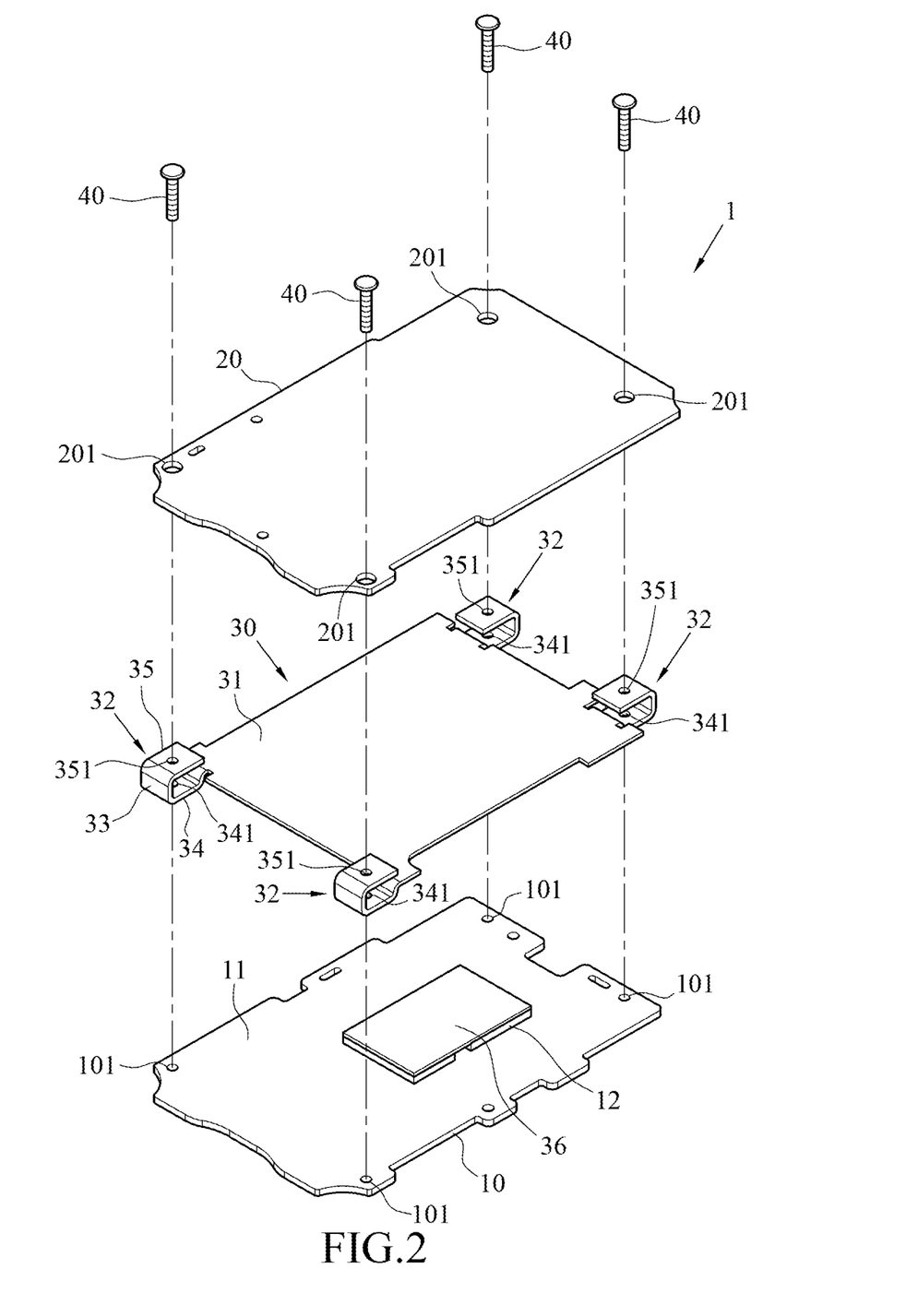
FIG. 2 illustrates an exploded view of the multi-layered circuit board structure of the first embodiment.
Figure 3:
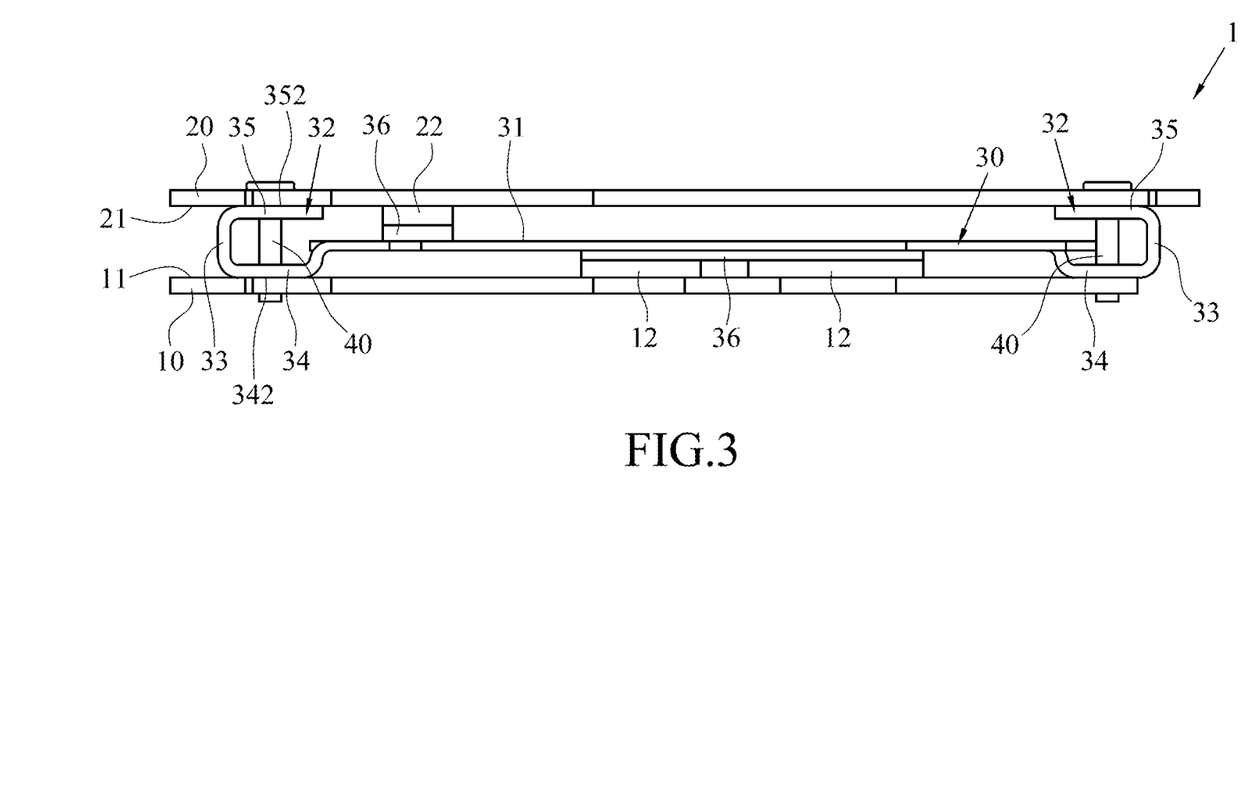
FIG. 3 illustrates a side view of the multi-layered circuit board structure of the first embodiment.

FIG. 1 illustrates a perspective view of a multi-layered circuit board structure according to a first embodiment of the instant disclosure. FIG. 2 illustrates an exploded view of the multi-layered circuit board structure of the first embodiment. FIG. 3 illustrates a side view of the multi-layered circuit board structure of the first embodiment. The multi-layered circuit board structure 1 may be a circuit board structure with two or more layers of circuit boards. For example, in this embodiment, the multi-layered circuit board structure 1 is a double-layered circuit board structure and comprises a first circuit board 10, a second circuit board 20, and a heat dissipation plate 30. In some embodiments, the multi-layered circuit board structure 1 may be utilized in various electronic devices, such as smart phones, tablet computers, notebook computers, video recorders, and digital cameras.

As shown in FIGS. 1 to 3, the heat dissipation plate 30 is located between the first circuit board 10 and the second circuit board 20. The first circuit board 10 and the second circuit board 20 are printed circuit boards. The first circuit board 10 has a first surface 11, and the second circuit board 20 has a second surface 21. In this embodiment, the first circuit board 10 is provided as the lower layer of the multi-layered circuit board structure 1, and the first surface 11 is the top surface of the first circuit board 10. The second circuit board 20 is provided as the upper layer of the multi-layered circuit board structure 1, and the second surface 21 is the bottom surface of the second circuit board 20 and faces the first surface 11 of the first circuit board 10. In some embodiments, the upper and lower configurations for the first circuit board 10 and the second circuit board 20 of the multi-layered circuit board structure 1 can be altered according to actual practices, and embodiments of the instant disclosure are not limited thereto.

As shown in FIGS. 1 to 3, the heat dissipation plate 30 is a plate made of heat conducting material(s) to perform the heat dissipation. For example, the heat dissipation plate 30 may be, but not limited to, made of a metal material (e.g., copper, aluminum, or stainless steel). The heat dissipation plate 30 has a substrate 31 and at least one fixing base 32, and the fixing base 32 is integrally extending from the substrate 31 and bent. In this embodiment, the heat dissipation plate 30 has four fixing bases 32, and the four fixing bases 32 are integrally extending from four corners of the substrate 31 and bent, respectively. It is understood that, the number and the position of the fixing base 32 of the heat dissipation plate 30 can be changed according to actual practices. For example, the heat dissipation plate 30 may have one fixing base 32 integrally extending from one side of the substrate 31 and bent, or the heat dissipation plate 30 may have two fixing bases 32 integrally extending from two different sides of the substrate 31 and bent, respectively.

As shown in FIGS. 1 to 3, in this embodiment, each of the fixing bases 32 of the heat dissipation plate 30 is a U-shaped plate; each of the fixing bases 32 has a connecting plate 33, a first plate 34, and a second plate 35 integrally formed with each other. The first plate 34 and the second plate 35 are spaced apart from each other. The connecting plate 33 is connected between the first plate 34 and the second plate 35. For example, the fixing base 32 is extending and bent toward one side of the substrate 31 (here as a specific example in this embodiment, extending toward the first circuit board 10) and then extending and bent toward a direction away from the substrate 31 to form the first plate 34; the connecting plate 33 and the second plate 35 are extending and bent toward another side of the substrate 31 (here as a specific example in this embodiment, extending toward the second circuit board 20) from an end portion of the first plate 34 to form the U-shaped plate, so that the first plate 34 and the second plate 35 are parallel aligned with and spaced apart from each other, and embodiments are not limited thereto. In some embodiments, the fixing base 32 may be of other shapes, for example, a Z shape or other irregular shapes.

As shown in FIGS. 2 and 3, the first surface 11 of the first circuit board 10 is bonded to the surface 342 of the first plate 34 of each of the fixing bases 32, and the second surface 21 of the second circuit board 20 is bonded to the surface 352 of the second plate 35 of each of the fixing bases 32. A distance between the first plate 34 and the second plate 35 is greater than the thickness of the substrate 31, so that the first circuit board 10 and the second circuit board 20 are respectively positioned at two opposite sides of the heat dissipation plate 30 and are spaced apart from each other, and the substrate 31 is in contact with neither the first surface 11 nor the second surface 21. In some embodiments, the bonding between the first circuit board 10 and each of the fixing bases 32, and the bonding between the second circuit board 20 and each of the fixing bases 32 may be achieved by different ways. For example, the bonding may be achieved by, but not limited to, adhering, locking, engaging, soldering, welding, or other ways facilitating heat conduction.

Accordingly, in the multi-layered circuit board structure 1 of one or some embodiments of the instant disclosure, the fixing base 32 is integrally extending from the heat dissipation plate 30 and bent. Therefore, in the manufacturing process, the first plate 34 and the second plate 35 of the fixing base 32 are respectively bonded with the first surface 11 of the first circuit board 10 and the second surface 21 of the second circuit board 20 to form the multi-layer circuit board structure 1. Hence, additional components (e.g., bolt holders) are not required to keep the first circuit board 10 and the second circuit board 20 spaced apart from each other and the manufacturing steps and time can be effectively reduced.

Furthermore, as shown in FIG. 3, in this embodiment, at least one heat generating element 12 is disposed on the first surface 11 of the first circuit board 10, and at least one heat generating element 22 is disposed on the second surface 21 of the second circuit board 20. For example, the heat generating elements 12, 22 are elements which may generate heat during operation, e.g., processors, memories, graphics cards, heat tubes, or radiator fans. In one embodiment, the heat generating elements 12, 22 may be directly in contact with the substrate 31 of the heat dissipation plate 30, so that the heat generated by the heat generating elements 12, 22 can be conducted to the heat dissipation plate 30. Alternatively, as shown in FIG. 3, a plurality of heat conducting bodies 36 may be disposed on the substrate 31 of the heat dissipation plate 30, and the heat conducting bodies 36 are in contact with the heat generating elements 12, 22 respectively, so that the heat generating elements 12, 22 are indirectly in contact with the substrate 31 of the heat dissipation plate 30 through the heat conducting bodies 36 for conducting the heat to the heat dissipation plate 30. In some embodiments, the heat conducting bodies 36 may be thermal tapes, thermal greases, or thermal pads (e.g., thermal silicone pads or metallic pads with thermal conductivities higher than the thermal conductivity of the heat dissipation plate 30), for improving the heat conduction efficiency to enhance the heat dissipation. Therefore, according to one or some embodiments of the instant disclosure, the fixing base 32, which is integrally extending from the heat dissipation plate 30 and bent, not only positions the first circuit board 10 and the second circuit board 20 but also increases the heat conduction area of the heat dissipation plate 30 to improve the heat dissipation efficiency.

It is understood that, the aforementioned embodiments are provided as illustrative purposes, not limitations. In some embodiments, the heat generating elements 12, 22 are proximal to but not in contact with the substrate 31 of the heat dissipation plate 30, such that the heat generated by the heat generating elements 12, 22 is delivered to the heat dissipation plate 30 by heat radiation.

As shown in FIGS. 2 and 3, in this embodiment, the first circuit board 10, the second circuit board 20, and each of the fixing bases 32 are assembled and positioned with each other through fixing shafts 40. In detail, the first circuit board 10 comprises a plurality of first assembling holes 101, and each of the first assembling holes 101 is defined through the first surface 11; the second circuit board 20 comprises a plurality of second assembling holes 201, and each of the second assembling holes 201 is defined through the second surface 21; the first plate 34 of each of the fixing bases 32 comprises a first through hole 341, and the second plate 35 of each of the fixing bases 32 comprises a second through hole 351. Each of the first assembling holes 101 is coaxially aligned with the corresponding first through hole 341, the corresponding second through hole 351, and the corresponding second assembling hole 201, and one fixing shaft 40 passes through the first assembling hole 101, the first through hole 341, the second through hole 351, and the second assembling hole 201, so that the first surface 11 of the first circuit board 10 is bonded to the surface 342 of the first plate 34 of each of the fixing bases 32 and that the second surface 21 of the second circuit board 20 is bonded to the surface 352 of the second plate 35 of each of the fixing bases 32. As a specific example, the fixing shafts 40 may be bolts, and the first assembling holes 101 of the first circuit board 10 or the second assembling holes 201 of the second circuit board 20 may be threaded holes, so that the fixing shafts 40 can be threaded with the first assembling holes 101 or threaded with the second assembling holes 201. Alternatively, in another embodiment, the fixing shafts 40 may be bolts, and the fixing shafts 40 pass through the second assembling holes 201, the second through holes 351, the first through holes 341, and the first assembling holes 101 to be locked with external nuts for positioning. Alternatively, in a further another embodiment, the fixing shafts 40 pass through the second assembling holes 201, the second through holes 351, the first through holes 341, and the first assembling holes 101, and two ends of each of the fixing shafts 40 are positioned with surfaces of the first circuit board 10 and the second circuit board 20 by hot-melting or soldering for positioning.

Figure 4:
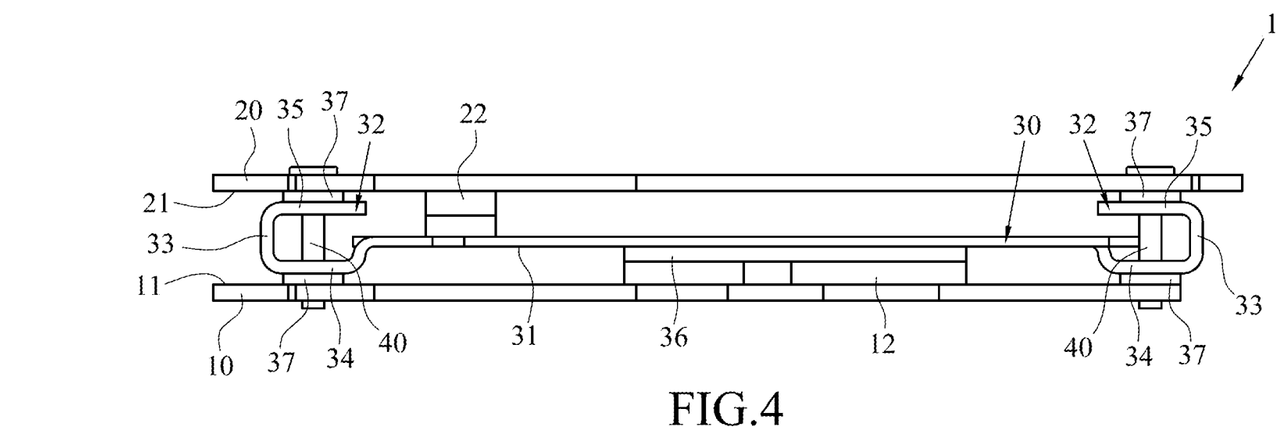
FIG. 4 illustrates a side view of a multi-layered circuit board structure according to a second embodiment of the instant disclosure.

In some embodiments, the first circuit board 10 and each of the fixing bases 32 may be bonded with each other by ways facilitating heat conduction; the second circuit board 20 and each of the fixing bases 32 may be bonded with each other by ways facilitating heat conduction. As shown in FIG. 4, FIG. 4 illustrates a side view of a multi-layered circuit board structure 1 according to a second embodiment of the instant disclosure. In this embodiment, heat conducting components 37 are disposed between the first plate 34 of each of the fixing bases 32 of the heat dissipation plate 30 and the first surface 11 of the first circuit board 10 and disposed between the second plate 35 of each of the fixing bases 32 of the heat dissipation plate 30 and the second surface 21 of the second circuit board 20, respectively. For example, the heat conducing components 37 may be thermal pads (e.g., thermal silicone pads or metallic pads with thermal conductivities higher than the thermal conductivity of the heat dissipation plate 30), for improving the heat conduction efficiency between the first circuit board 10 and each of the fixing bases 32 and the heat conduction efficiency between the second circuit board 20 and each of the fixing bases 32 to enhance the heat dissipation. Alternatively, the heat conducting components 37 may be thermal glues (e.g., thermal tapes or thermal greases), so that the positioning between the first circuit board 10, the second circuit board 20, and each of the fixing bases 32 can be improved.

Figure 5:
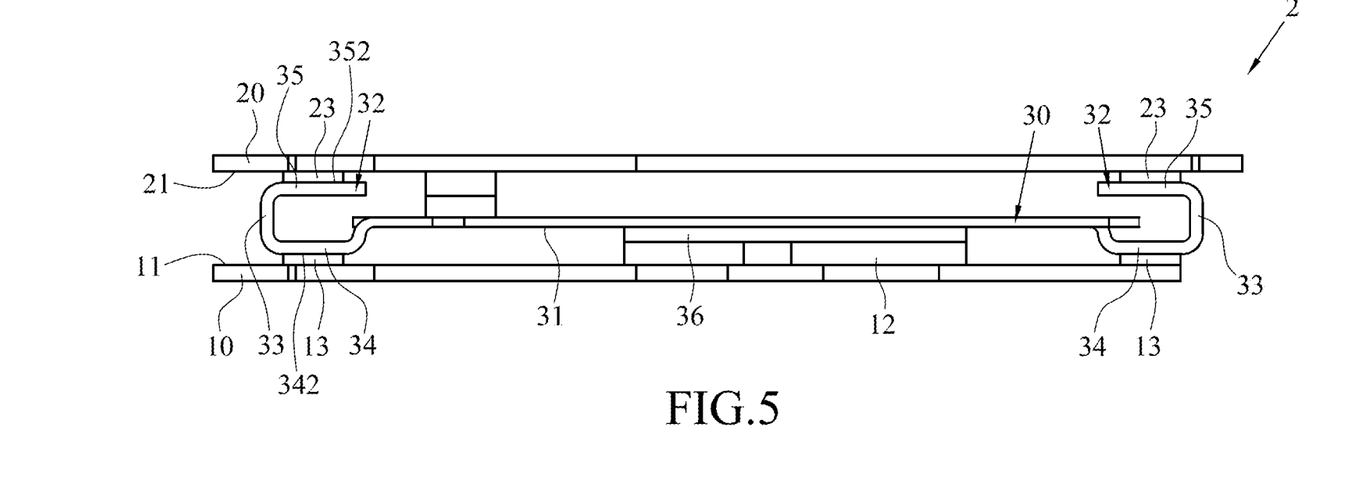
FIG. 5 illustrates a side view of a multi-layered circuit board structure according to a third embodiment of the instant disclosure.

Alternatively, as shown in FIG. 5, FIG. 5 illustrates a side view of a multi-layered circuit board structure according to a third embodiment of the instant disclosure. In this embodiment of the multi-layered circuit board structure 2, the first circuit board 10 and each of the fixing bases 32 are bonded to each other by adhering; the second circuit board 20 and each of the fixing bases 32 are bonded to each other by adhering. Specifically, the first surface 11 of the first circuit board 10 has glue layers 13 thereon, and the glue layers 13 are adhered to the surfaces 342 of the first plates 34 of the fixing bases 32, respectively; the second surface 21 of the second circuit board 20 has glue layers 23 thereon, and the glue layers 23 are adhered to the surfaces 352 of the second plates 35 of the fixing bases 32, respectively. Therefore, the first circuit board 10 and the second circuit board 20 can be adhered to two opposite sides of the heat dissipation plate 30. In some embodiments, the glue layers 13, 23 may be super glues, instant glues, or epoxy glues. Alternatively, the glue layers 13, 23 may be thermal glue layers, for example, thermal tapes or thermal greases, for improving the heat conduction efficiency between the first circuit board 10, the second circuit board 20, and each of the fixing bases 32 to enhance the heat dissipation.

Figure 6:
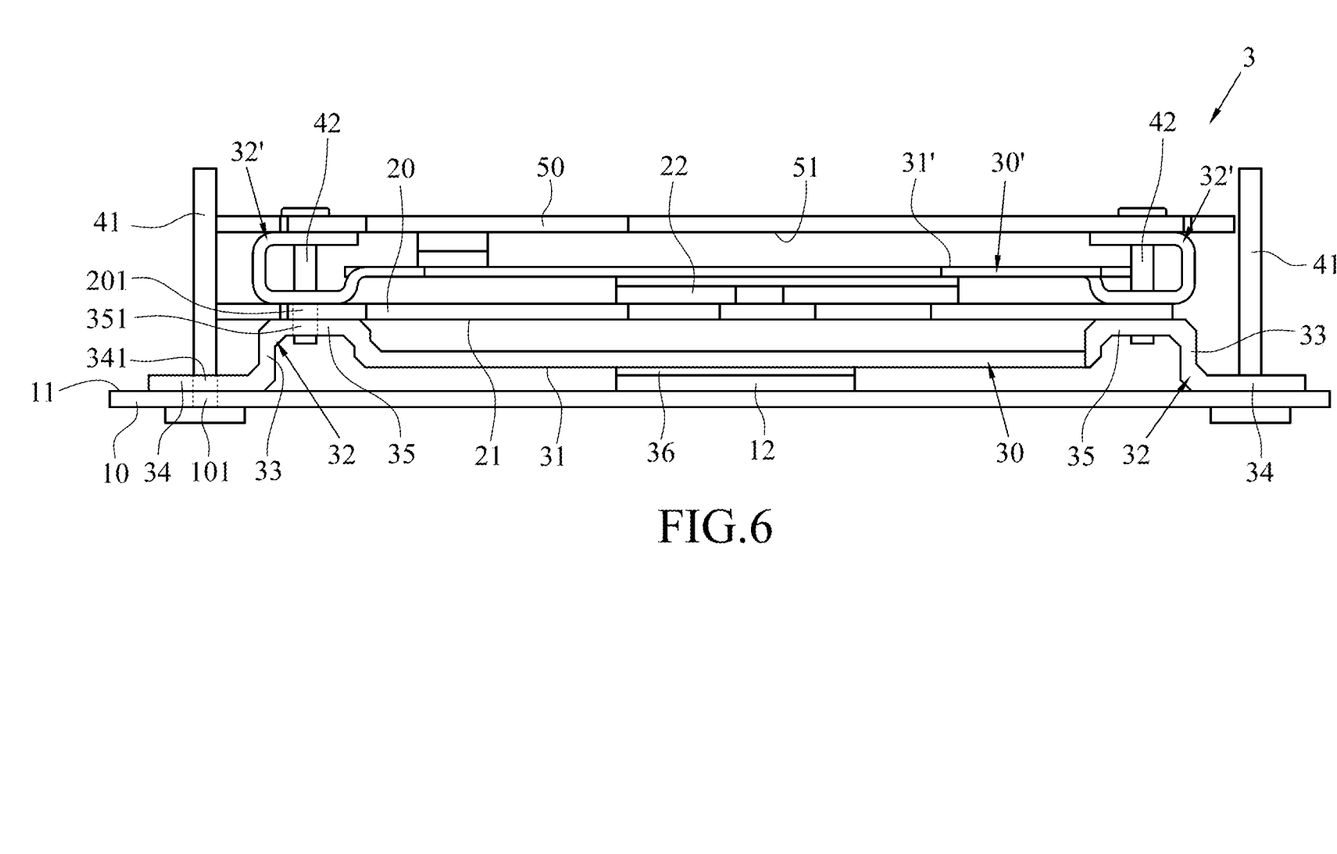
FIG. 6 illustrates a side view of a multi-layered circuit board structure according to a fourth embodiment of the instant disclosure.
Figure 7:
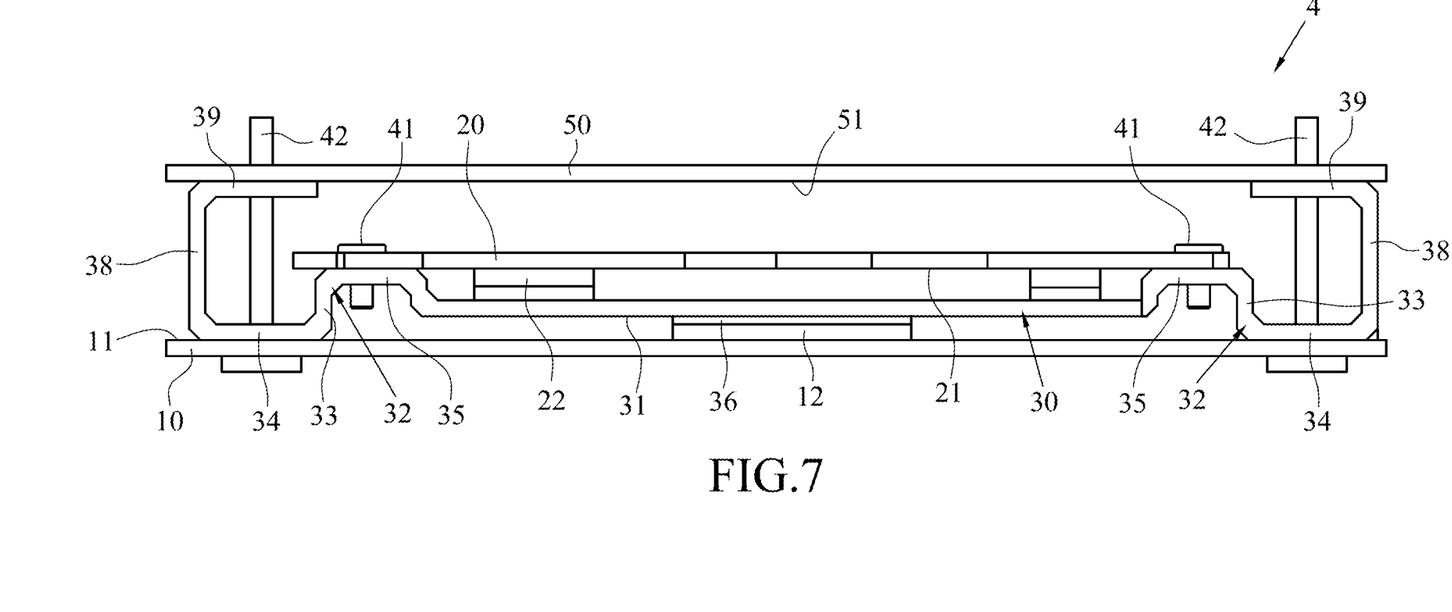
FIG. 7 illustrates a side view of a multi-layered circuit board structure according to a fifth embodiment of the instant disclosure.

As shown in FIGS. 6 and 7, in some embodiments, the multi-layer circuit board structures 3, 4 may be a three-layered circuit board structure, so that more electronic components can be disposed within a limited space. As shown in FIG. 6, FIG. 6 illustrates a side view of a multi-layered circuit board structure according to a fourth embodiment of the instant disclosure. As compared with the embodiment of multi-layered circuit board structure 1 shown in FIG. 3, the multi-layered circuit board structure 3 of this embodiment further comprises a third circuit board 50 and a second heat dissipation plate 30'. The second circuit board 20 is located between the first circuit board 10 and the third circuit board 50. The third circuit board 50 comprises a third surface 51 facing the second circuit board 20. The second heat dissipation plate 30' is located between the third circuit board 50 and the second circuit board 20. The second heat dissipation plate 30' also has a substrate 31' and a plurality of fixing bases 32' integrally extending from the substrate 31' and bent. A surface of the second circuit board 20 (e.g., the surface opposite to the second surface 21) and the third surface 51 of the third circuit board 50 are bonded to two opposite sides of each of the fixing bases 32', so that the second circuit board 20 and the third circuit board 50 are spaced apart from each other. Each of the fixing bases 32' may be of a U shape (for example, having the same structure of the fixing base 32 shown in FIG. 3), a Z shape, or other irregular shape. Furthermore, in some embodiments, the second circuit board 20, the third circuit board 50, and each of the fixing bases 32' may be, but not limited to, bonded to each other by different ways, e.g., adhering, locking, engaging, soldering, or welding.

Further, as shown in FIG. 6, as compared with the embodiment shown in FIG. 3, in this embodiment, each of the fixing bases 32 of the heat dissipation plate 30 between the first circuit board 10 and the second circuit board 20 is of a Z-shape structure, and the second plate 35 is not overlapped above the first plate 34. For example, the fixing base 32 is extending and bent toward one side of the substrate 31 (here as a specific example in this embodiment, extending toward the second circuit board 20) and then extending and bent toward a direction away from the substrate 31 to form the second plate 35; the fixing base 32 is further extending and bent toward another side of the substrate 31 (here as a specific example in this embodiment, extending toward the first circuit board 10) and then extending and bent toward the direction away from the substrate 31 to form the connecting plate 33 and the first plate 34. Hence, for each of the fixing bases 32, the first through hole 341 of the first plate 34 and the second through hole 351 of the second plate 35 are not coaxially aligned; on the other hand, each of the first assembling holes 101 of the first circuit board 10 and the corresponding first through hole 341 are coaxially aligned with each other, and one first fixing shaft 41 passes through the first assembling hole 101 and the corresponding first through hole 341, so that the first surface 11 of the first circuit board 10 is bonded to the first plate 34 of each of the fixing bases 32. Similarly, for each of the fixing bases 32, each of the second assembling hole 201 of the second circuit board 20 and the corresponding second through hole 351 are coaxially aligned with each other, and one second fixing shaft 42 passes through the second assembling hole 201 and the corresponding second through hole 351, so that the second surface 21 of the second circuit board 20 is bonded to the second plate 35 of each of the fixing bases 32. Furthermore, in this embodiment, the second fixing shafts 42 further pass through the fixing bases 32' of the second heat dissipation plate 30' and the third circuit board 50 for positioning, but embodiments of the instant disclosure are not limited thereto.

As shown in FIG. 7, FIG. 7 illustrates a side view of a multi-layered circuit board structure according to a fifth embodiment of the instant disclosure. As compared with the embodiment shown in FIG. 6, in the multi-layered circuit board structure 4 of this embodiment, each of the fixing bases 32 of the heat dissipation plate 30 is further bonded to the third surface 51 of the third circuit board 30. In detail, the heat dissipation plate 30 further comprises a linking plate 38 and a third plate 39. The linking plate 38 is extending from an end portion of the first plate 34 and bent toward the third circuit board 50, the third plate 39 is extending from an end portion of the linking plate 38, bent toward a direction toward the substrate 31, and bonded to the third surface 51 of the third circuit board 50, such that the third circuit board 50 and the second circuit board 20 can be spaced apart from each other.

While the instant disclosure has been described by the way of example and in terms of the preferred embodiments, it is to be understood that the invention need not be limited to the disclosed embodiments. On the contrary, it is intended to cover various modifications and similar arrangements included within the spirit and scope of the appended claims, the scope of which should be accorded the broadest interpretation so as to encompass all such modifications and similar structures.

What is claimed is:

1. A multi-layer circuit board structure, comprising:
a first circuit board comprising a first surface;
a second circuit board comprising a second surface facing the first surface; and
a heat dissipation plate located between the first circuit board and the second circuit board, wherein the heat dissipation plate comprises a substrate and a fixing base, the fixing base is integrally extending from the substrate and bent, the fixing base comprises a connecting plate, a first plate, and a second plate spaced apart from the first plate, the connecting plate is connected between the first plate and the second plate;
wherein the first surface of the first circuit board is bonded to a surface of the first plate, the second surface of the second circuit board is bonded to a surface of the second plate, and the substrate is in contact with neither the first surface nor the second surface;
wherein a heat generating element is disposed on the first surface of the first circuit board.

2. The multi-layer circuit board structure according to claim 1, wherein the first circuit board comprises a first assembling hole, the first assembling hole is defined through the first surface, the second circuit board comprises a second assembling hole, the second assembling hole is defined through the second surface, the first plate comprises a first through hole, the second plate comprises a second through hole, the first assembling hole, the first through hole, the second through hole, and the second assembling hole are coaxially aligned, and a fixing shaft passes through the first assembling hole, the first through hole, the second through hole, and the second assembling hole.

3. The multi-layer circuit board structure according to claim 1, wherein the first circuit board comprises a first assembling hole, the first assembling hole is defined through the first surface, the second circuit board comprises a second assembling hole, the second assembling hole is defined through the second surface, the first plate comprises a first through hole, the second plate comprises a second through hole, the first through hole and the second through hole are not coaxially aligned with each other, the first assembling hole and the first through hole are aligned coaxially, and a first fixing shaft passes through the first assembling hole and the first through hole; the second assembling hole and the second through hole are aligned coaxially, and a second fixing shaft passes through the second assembling hole and the second through hole.

4. The multi-layer circuit board structure according to claim 3, further comprising:
a third circuit board, comprising a third surface facing the second circuit board, wherein the second circuit board is located between the first circuit board and the third circuit board; and
a second heat dissipation plate, located between the third circuit board and the second circuit board and comprising a substrate and a fixing bases integrally extending from the substrate of the second heat dissipation plate and bent;
wherein the surface opposite to the second surface of the second circuit board and the third surface of the third circuit board are bonded to opposite sides of the fixing base of the second heat dissipation plate such that the second circuit board and the third circuit board are spaced apart from each other.

5. The multi-layer circuit board structure according to claim 4, wherein the second fixing shaft further passes through the fixing base of the second heat dissipation plate and the third circuit board.

6. The multi-layer circuit board structure according to claim 2, wherein the first assembling hole or the second assembling hole is a threaded hole.

7. The multi-layer circuit board structure according to claim 3, wherein the first assembling hole or the second assembling hole is a threaded hole.

8. The multi-layer circuit board structure according to claim 1, wherein a heat conducting body is further disposed on the substrate of the heat dissipation plate, and the heat conducting body is in contact with the heat generating element.

9. A multi-layer circuit board structure, comprising:
a first circuit board comprising a first surface;
a second circuit board comprising a second surface facing the first surface; and
a heat dissipation plate located between the first circuit board and the second circuit board, wherein the heat dissipation plate comprises a substrate and a fixing base, the fixing base is integrally extending from the substrate and bent, the fixing base comprises a connecting plate, a first plate, and a second plate spaced apart from the first plate, the connecting plate is connected between the first plate and the second plate;
wherein the first surface of the first circuit board is bonded to a surface of the first plate, the second surface of the second circuit board is bonded to a surface of the second plate, and the substrate is in contact with neither the first surface nor the second surface;
wherein a heat conducting component is disposed between the surface of the first plate and the first surface of the first circuit board.

10. The multi-layer circuit board structure according to claim 1, wherein the heat dissipation plate further comprises a second fixing base, the second fixing base is integrally extending from the substrate and bent, and the fixing base and the second fixing base are located at different sides of the substrate.

11. The multi-layer circuit board structure according to claim 1, wherein the first surface has a glue layer, and the glue layer is adhered to the surface of the first plate.

12. The multi-layer circuit board structure according to claim 11, wherein the glue layer is a heat conducting glue layer.

13. The multi-layer circuit board structure according to claim 1, further comprising a third circuit board, wherein the second circuit board is located between the first circuit board and the third circuit board, the third circuit board comprises a third surface facing the second circuit board, the heat dissipation plate further comprises a linking plate and a third plate, the third plate is spaced apart from the second plate, the linking plate is connected between the second plate and the third plate, and the third surface of the third circuit board is bonded to a surface of the third plate.

14. The multi-layer circuit board structure according to claim 1, wherein the fixing base is of a U shape.

15. The multi-layer circuit board structure according to claim 1, wherein the fixing base is of a Z shape.

16. The multi-layer circuit board structure according to claim 1, wherein the heat dissipation plate comprises four of the fixing base, and the four fixing bases are respectively integrally extending from four corners of the substrate and bent.

17. The multi-layer circuit board structure according to claim 1, wherein the heat dissipation plate comprises two of the fixing base, and the two fixing bases are respectively integrally extending from two different sides of the substrate and bent.

* * * * *